United States Patent
Anzai et al.

[11] Patent Number: 6,114,909
[45] Date of Patent: Sep. 5, 2000

[54] DIFFERENTIAL AMPLIFIER FOR CORRECTING OFFSETS AT INPUTS USING LOW CAPACITANCE CAPACITOR

[75] Inventors: Fukuji Anzai, Ashikaga; Hidekazu Inoue, Ota, both of Japan

[73] Assignee: Sanyo Electric Co., Ltd., Osaka, Japan

[21] Appl. No.: 08/863,844

[22] Filed: May 27, 1997

[30] Foreign Application Priority Data

May 31, 1996 [JP] Japan ................................. 8-139202

[51] Int. Cl.[7] ...................................................... H03F 3/45
[52] U.S. Cl. ............................................ 330/259; 330/290
[58] Field of Search ..................................... 330/259, 290, 330/97, 252, 260, 9

[56] References Cited

U.S. PATENT DOCUMENTS

| | | | |
|---|---|---|---|
| 5,392,002 | 2/1995 | Delano | 330/252 |
| 5,399,988 | 3/1995 | Knierim | 330/252 |
| 5,525,930 | 6/1996 | Pothast et al. | 330/252 |
| 5,757,232 | 5/1998 | Hosoya | 330/252 |
| 5,838,197 | 11/1998 | Tsukuda | 330/259 |
| 5,867,062 | 2/1999 | Kudou | 330/124 R |

FOREIGN PATENT DOCUMENTS 0142210  5/1990  Japan ..................................... 330/252

Primary Examiner—Robert Pascal
Assistant Examiner—Khanh Van Nguyen
Attorney, Agent, or Firm—Loeb & Loeb, LLP

[57] ABSTRACT

A differential amplifier (24) includes a pair of transistors (Q2 and Q9); a differential amplifier 25 includes a pair of transistors (Q3 and Q6). A difference in output currents at the differential amplifier (24) is detected by differential amplifier (25). Then, transistors (Q3 and Q6) in differential amplifier (25) supply currents flowing therein into transistors (Q4 and Q5), whose bases are connected to each other via a capacitor (26). With this arrangement, a difference in DC components between a pair of differential currents flowing in the differential amplifier (25) is obtained at both terminals of the capacitor (26). The obtained voltages at the both terminals of the capacitor (26) are fed back to the input of the differential amplifier (24) via transistors (Q1 and Q8), so that offsets at inputs of the differential amplifier (24) are corrected.

8 Claims, 3 Drawing Sheets

DIFFERENTIAL AMPLIFIER FOR CORRECTING OFFSETS AT INPUTS USING LOW CAPACITANCE CAPACITOR

BACKGROUND OF THE INVENTION

1. Field of the Invention

This invention relates to a differential amplifier for use in a video head amplifier employed in a home VTR, and in particular, to a differential amplifier applicable for circuit integration.

2. Description of the Prior Art

FIG. 1 shows a circuit for a conventional circuit-integrated video head amplifier. Reproduction video signals supplied by a video head are inputted via an input 2 and transmitted to the base of an emitter-grounded transistor 3 which is incorporated into the integrated circuit. The transistor 3 is also connected via its collector to a transistor 4 in a cascade connection. Transistor 4 is in turn connected to the base of a transistor 5. In other words, the collector of the transistor 3 is connected to the emitter of the transistor 4 and the collector of the transistor 4 is connected to the base of the transistor 5. Thus, the reproduction video signals supplied are inputted to the base of transistor 5.

Transistor 5 then outputs signals via its emitter to transistors 7 and 8 of a differential amplifier 6. Since transistor 8 also receives, via its base, a DC output signal from a smoothing circuit which comprises a resistor 9 and a capacitor 10, differential amplifier 6 resultantly amplifies AC components in the reproduction video signals before transmitting them into an output terminal 12. Signals outputted from the emitter of transistor 5 are also supplied to a transistor 13 and then a feedback resistor 14, and eventually fed back to the base of emitter-grounded transistor 3.

According to the circuit of FIG. 1, a reproduction video signal from a video head can be amplified before being outputted.

This circuit, however, requires an external smoothing capacitor 10, so a dedicated IC pin is required for capacitor 10.

For a four-head video amplifier, four sets of the above circuits, each including the IC pin and capacitor 10 are necessary. Although an external capacitor to be connected to an IC pin may be included in an integrated circuit, a resistor 9 having a large resistive value must be employed in such a case, to ensure the same time-constant as that which would be obtained with a capacitor externally provided because a large-capacitance capacitor cannot be incorporated into an integrated circuit.

A large value of resistor 9, however, will cause a drop in the voltage at the base of transmitter 8 when a base current thereof is caused to flow into resistor 9. As a result, a DC base voltage level becomes different between transistors 7 and 8 both included in differential amplifier 6, causing distortion of a video signal to be amplified by differential amplifier 6.

SUMMARY OF THE INVENTION

The present invention has been conceived to overcome the above problems and aims to provide a differential amplifier capable of correcting offsets appearing in an input signal, using a small capacitance capacitor.

According to the present invention, there is provided a differential amplifier for correcting offsets at an input, comprising:

a differential amplifier for amplifying an input signal to provide output signals;

a difference detector for detecting a difference between two output signals having opposite phases provided by the differential amplifier to output a differential current;

a conversion transistor for outputting the differential current outputted by the difference detector as a collector current;

a capacitor connected to a base of the conversion transistor, for smoothing a base voltage of the conversion transistor to obtain a DC control voltage; and a correction circuit for correcting a DC offset voltage of an input signal based on the DC control voltage obtained by the capacitor.

As described above, a difference detector detects a difference between output signals from a differential amplifier in this invention to obtain a differential current. The differential current is then supplied to a conversion transistor, where it is converted into a base current. As the conversion transistor is connected to a smoothing capacitor, the capacitor smoothes the differential current by dividing it by an amplification factor of the conversion transistor. With this arrangement, a capacitor may have a small capacitance, and is thus easily incorporated into an integrated circuit. Moreover, offsets can be automatically corrected in this arrangement in which a voltage obtained by the capacitor is fed back to the input of the differential amplifier.

Note that a signal to be inputted into a differential amplifier may or may not be variable with respect to its polarity. In order to cope with a signal of variable polarity, a pair of correction circuits and other members may be provided which can respond to signals having negative or positive polarity.

BRIEF DESCRIPTION OF THE DRAWINGS

The above and other objects, features, and advantages, will become further apparent from the following description of the preferred embodiment taken in conjunction with the accompanying drawings wherein.

DESCRIPTION OF THE PREFERRED EMBODIMENTS

Figure 1:
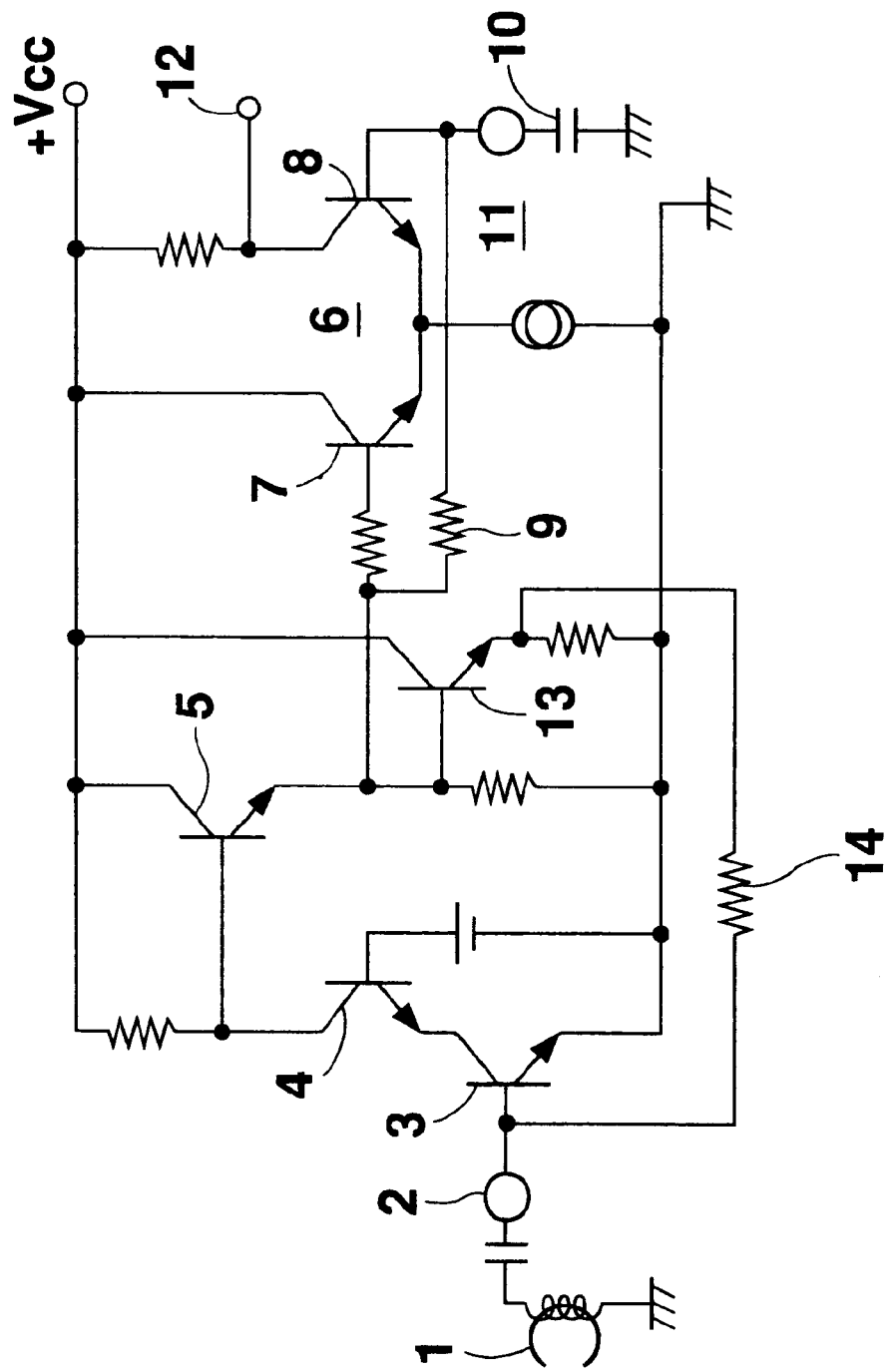
FIG. 1 shows the circuit of a conventional differential amplifier.
Figure 2:
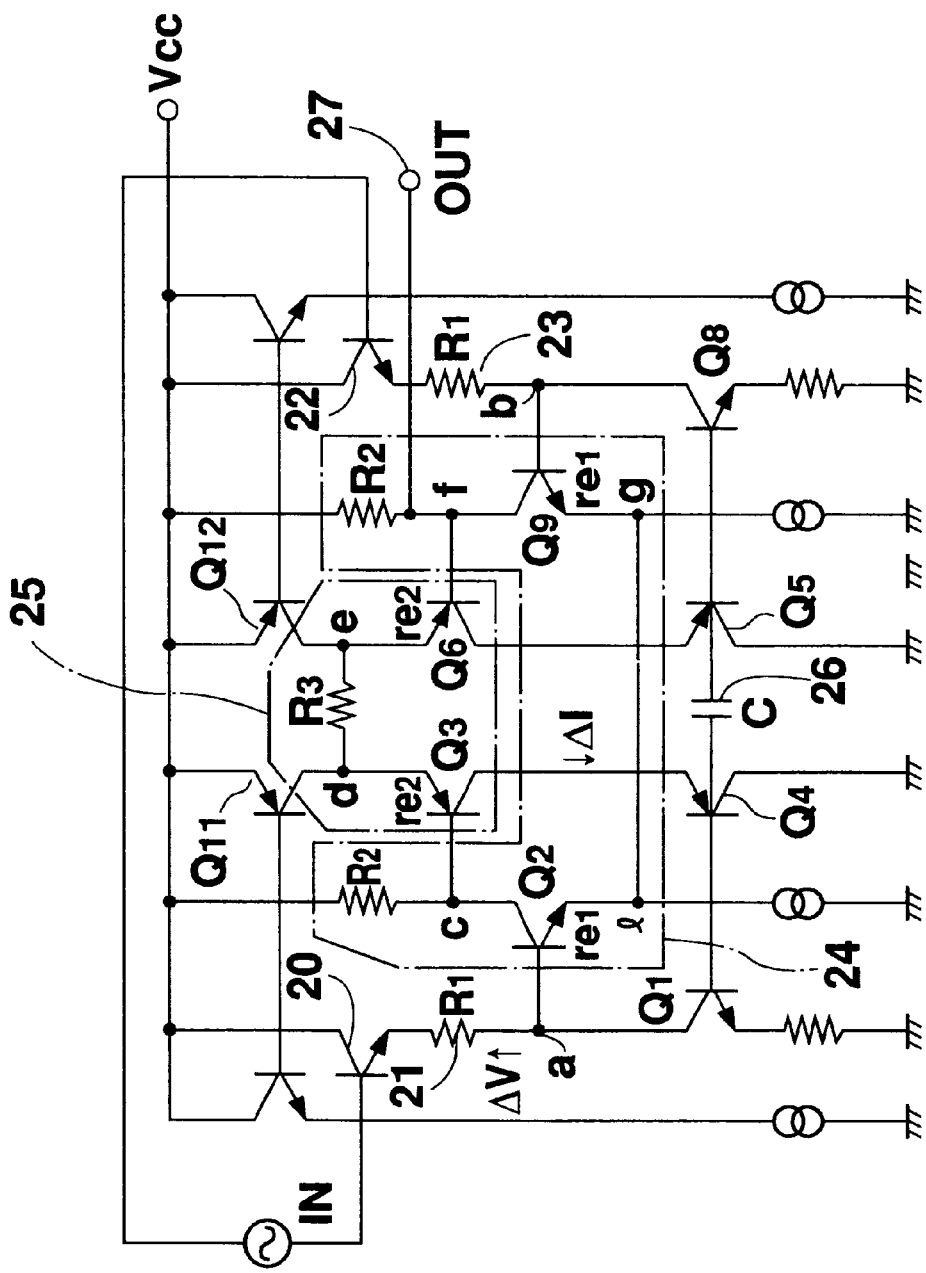
FIG. 2 shows the circuit of a differential amplifier of the present invention.

FIG. 2 shows the circuit of a differential amplifier of the present invention. A transistor 20 and a resistor 21 constitute a first correction circuit for correcting the DC level of a signal from transistor 5 shown in FIG. 1, responding to a control signal. A transistor 22 and a resistor 23 constitute a second correction circuit for correcting the DC level of an inverted signal of a signal from transistor 5, in response to a control signal. A differential amplifier 24, including transistors Q2 and Q9, amplifies a signal indicating a difference (a differential signal) between signals outputted from the first and second correction circuits.

A differential amplifier 25, including transistors Q3 and Q6, obtains a signal indicating a difference (a differential signal) between amplified signals having opposite phases, outputted from differential amplifier 24, to detect a differential current. Transistor Q3 is connected via its collector to the emitter of a conversion transistor Q4, while transistor Q6 is connected via its collector to the emitter of a conversion transistor Q5. Transistors Q4 and Q5 are connected to each other via respective bases, having a capacitor 26 in between. Using the base voltage at transistor Q4 as a control signal, a feedback transistor Q1 controls a DC voltage at the base of transistor Q2. Similarly, a second feedback transistor QB controls a DC voltage at the base of transistor Q9, using the base voltage at transistor Q5 as a control signal. Transistor Q1 constitutes a part of the first correction circuit while transistor Q8 constitutes a part of the second correction circuit.

In FIG. 2, a signal source IN outputs a pair of signals having opposite phases. These signals are equivalent to a signal outputted from transistor 5 in FIG. 1. With consideration given to the phases of signals to be supplied to differential amplifiers 6 and 24, a signal to be inputted to the base of transistor 22 has the same phase as that of the signal from transistor 5. Note that a differential amplifier having a pair of transistors is employed in this circuit in place of a transistor 5 in FIG. 1. This makes it possible to produce a pair of input signals having opposite phases.

Each of a pair of input signals having opposite phases are supplied to the base of transistor 20 and to the base of transistor 22. The pair of input signals are inputted to bases of the NPN-type transistors 20 and 22, whose collectors are connected to a power supply Vcc. After being outputted by the transistors 20 and 22, the currents are supplied via resistors 21 and 23 to the bases of a pair of transistors Q2 and Q9, respectively, which are included in differential amplifier 24. That is, transistors Q2 and Q9 receive currents which correspond to the pair of input signals. As the collector of transistor Q9 is connected to an output terminal 27, a signal OUT is obtained at to the output terminal 27. In this circuit, transistors Q2 and Q9 are both NPN-type, connected via resistors each having a resistance value R2 to a power supply Vcc. These transistors Q2 and Q9 are also connected to each other via points l and g on their respective emitter sides, and further grounded via constant power supplies.

Points c and f on the respective collector sides of transistor Q2 and Q9 in differential amplifier 24 are connected to the bases of a pair of transistors Q3 and Q6 in differential amplifier 25, respectively. With this connection, transistors Q3 and Q6 are respectively supplied with currents which correspond to a pair of currents having opposite phases, outputted from differential amplifier 24. Transistors Q3 and Q6, which are of PNP type, are shorted on their emitter sides by a resistor R3. In FIG. 2, the emitters of transistor Q3 and Q6 are connected to a power supply Vcc via PNP-type transistors Q11 and Q12 which output constant currents, respectively.

The collectors of transistors Q3 and Q6 are connected to emitters of PNP-type transistors Q4 and Q5, respectively, whose collectors are grounded. That is, transistors Q4 and Q5 receive identical collector currents to those of transistors Q3 and Q6, respectively, and then require base currents corresponding to the collector currents. The base currents each have a small value equivalent to those obtained by dividing a collector current by a current amplification factor.

Since transistors Q4 and Q5 are connected to each other via their bases having a capacitor 26 in between, as mentioned above, their base voltages are smoothed by the capacitor 26, so that a DC voltage difference between the currents outputted by transistors Q3 and Q6, that is, an offset voltage, is obtained at both ends of capacitor 26.

The bases of transistor Q4 and Q5 are connected to the bases of transistors Q1 and Q8, respectively, so that the smoothed voltage values are applied to transistors Q2 and Q9 via transistors Q1 and Q8. As a result of this feedback, offsets at transistors Q2 and Q9 are corrected accordingly. Transistors Q1 ad Q8 are of NPN-type, whose collectors are connected to the bases of transistors Q2 and Q9, and emitters are grounded via adjustment resistors.

As described above, in the circuit shown in FIG. 2, transistor 20 supplies a signal to a differential amplifier 24, where it is then amplified and transmitted to an output terminal 27. During the above transmission, the base voltage at transistor Q2 is corrected, referring to the informed value of the offset voltage by means of feedback, so as to match to that at transistor Q9. To be more specific, second differential amplifier 25, including transistors Q3 and Q6, detects an offset voltage; the offset voltage detected is converted into the currents of transistors Q3 and Q6, and then base currents of transistors Q4 and Q5, that is a very small current compared with the collector currents of transistors Q4 and Q5; and the base currents are smoothed using a small capacitance capacitor.

Currents corresponding to the smoothed voltage are supplied to collectors of transistors Q1 and Q8, so that voltages at points a and b, and eventually the bases of transistors Q2 and Q9, are corrected based on the currents supplied from transistors Q1 and Q8.

Assume a DC voltage at the point a is increased by ΔV in FIG. 2. The potential Vc at the point c is then decreased by $$Vc = -\frac{R2}{2re1}\Delta V \qquad (1)$$

wherein R2 is a resistor value, and re1 is a resistor value within the emitter of transistor Q2.

On the other hand, if a DC voltage at the point b is decreased by ΔV, the potential Vc at the point f is increased by $$Vf = +\frac{R2}{2re1}\Delta V \qquad (2)$$

wherein R2 is a resistor value, and re1 is a resistor value within the emitter of transistor Q7.

With these changes, the difference V(e–d) in the potential between the points d and e in FIG. 2 becomes $$V(e - d) = (f + V_{BE}) - (c + V_{BE}) = \frac{R2}{re1}\Delta V \qquad (3)$$

wherein VBE is a voltage between the base and the emitter of either transistor Q3 or Q6.

Having detected the difference V(e–d), i.e., the voltage corresponding to an offset voltage of the bases of transistors Q2 and Q9, second differential amplifier 25 supplies a differential current ΔI corresponding to the offset voltage to the collector of transistor Q3.

A differential current ΔI is obtained as $$\Delta I = \frac{\frac{R2}{re1}\Delta V}{2re2 + R3}$$
$$= \frac{R2}{re1(2re2 + R3)}\Delta V \qquad (4)$$

from the equation 3, wherein R2 and R3 are resistance values.

The differential current ΔI is further supplied to transistor Q4, where it is converted into a base current. The converted base current is 1/(βQ4) times as large as the differential current ΔI supplied, wherein βQ4 is a current amplification factor of transistor Q4.

Subsequently, the base current of transistor Q4 is transmitted to transistor Q1, where it is then converted into a collector current. The converted collector current is βQ1 times as large as the base current supplied.

The collector current IQ1 at transistor Q1 is expressed as $$IQ1 = \frac{\beta Q1}{\beta Q4} \Delta I \quad (5)$$

Here, if a product of a collector current IQ1 and a resistance value R1 of resistor 21 is larger than ΔV, negative feedback is invoked to correct offsets. Therefore, the circuit in FIG. 2 is activated under the condition $$\frac{\beta Q1}{\beta Q4} \Delta I \cdot R1 > \Delta V \quad (6)$$

When a differential voltage ΔI can be expressed using ΔV, as the equation 4, the equation 6 can be modified into $$\frac{R1 \cdot R2}{re1(2re2 + R3)} \cdot \frac{\beta Q1}{\beta Q4} \cdot \Delta V > \Delta V \quad (7)$$

Eliminating ΔV, the equation 7 is further modified into $$\frac{R1 \cdot R2}{re1(2re2 + R3)} \cdot \frac{\beta Q1}{\beta Q4} > 1 \quad (8)$$

In other words, when resistances values R1, R2, R3 and a current amplification factor are determined so as to meet the equation 8, offsets are resultantly corrected.

In the above example, a pair of input signals have different polarities. However, signals may have the same polarity. In such a case, either transistor 21 or 22 will be activated depending on the polarity of a signal inputted, so that a signal having either negative or positive polarity alone is obtained at output terminal 27.

Figure 3:
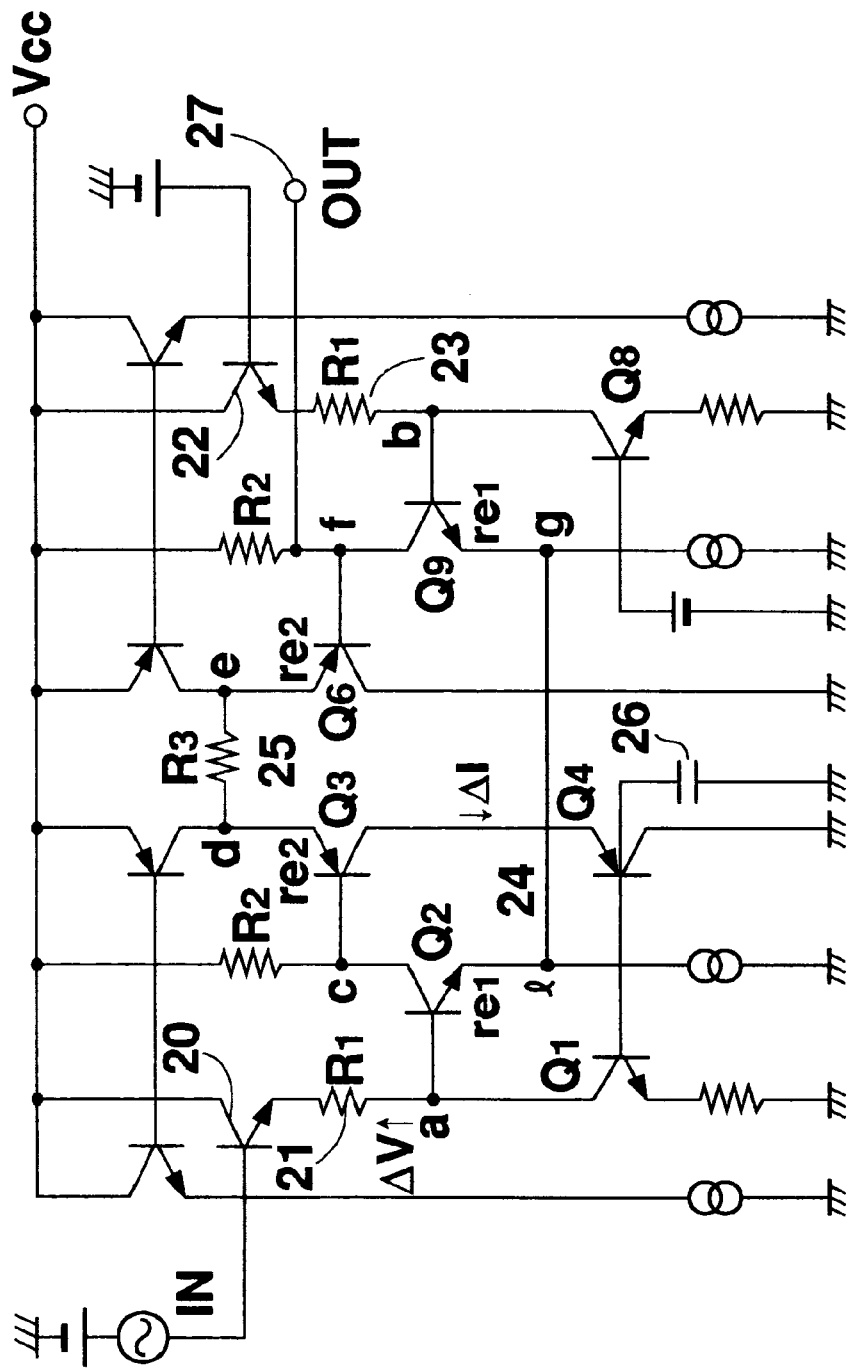
FIG. 3 shows the circuit of another differential amplifier of the present invention.

FIG. 3 shows a circuit for this case where signals having one polarity are inputted. Referring to the drawing, a signal source is subjected to DC bias to have a predetermined positive voltage. This bias voltage is supplied to the base of transistor 20. Transistor 22 also receives, via its base, a constant DC voltage, so that a signal multiplied according to the bias voltage having been applied to the base of transistor 20 is finally obtained at output terminal 27.

In this circuit, transistor Q9 always outputs a constant current. Thus, transistor Q5 can be omitted, and the collector of transistor Q6 is grounded directly. A constant DC voltage is also supplied to the base of transistor Q8.

Accompanying the omission of transistor Q5, capacitor 26, connected to the base of transistor Q4 at one end, is grounded at another end.

As described above, an offset voltage at transistor Q2 appears as a DC component of the base current of transistor Q4. This is smoothed by capacitor 26, becoming a base voltage of transistor Q4. The base voltage is then fed back via transistor Q1 so that offsets are corrected at transistor Q2 according to the base voltage fed back.

What is claimed is:

1. A differential amplifier for correcting offsets at an input, comprising:
   a differential amplifier for amplifying an input signal to provide output signals;
   a difference detector for detecting a difference between two output signals having opposite phases provided by the differential amplifier to output a differential current;
   a conversion transistor for outputting the differential current outputted by the difference detector as a collector current;
   a capacitor connected to a base of the conversion transistor, for smoothing a base voltage of the conversion transistor to obtain a DC control voltage; and
   a correction circuit for correcting a DC offset voltage of an input signal based on the DC control voltage obtained by the capacitor.

2. A differential amplifier as defined in claim 1, wherein the correction circuit includes
   an input transistor for receiving an input signal via its base; and
   a feedback transistor for controlling a DC voltage at an output of the input transistor based on the DC control voltage received via its base.

3. A differential amplifier as defined in claim 2, wherein the correction circuit further includes
   a resistor for passing emitter currents of the input transistor and collector currents of the feedback transistor to supply the input signal to the differential amplifier.

4. A differential amplifier as defined in claim 1, wherein the difference detector includes
   a difference detection differential amplifier having a pair of difference detection transistors.

5. A differential amplifier for correcting offsets at an input, comprising:
   a differential amplifier for amplifying a pair of input signals having opposite phases to provide output signals;
   a difference detector for detecting a difference between two output signals having opposite phases provided by the differential amplifier to output two differential currents corresponding to the difference, the differential currents having opposite phases from each other;
   a pair of conversion transistors for converting two differential currents outputted by the difference detector to transmit as collector currents;
   a capacitor connected between bases of the pair of conversion transistors, for smoothing base voltages of the pair of conversion transistors; and
   first and second correction circuits for correcting DC offset voltages of the pair of input signals based on the base voltages of the pair of conversion transistors, obtained by the capacitor.

6. A differential amplifier as defined in claim 5, wherein the first and second correction circuits each include
   an input transistor for receiving an input signal at its base; and
   a feedback transistor for controlling a DC voltage at an output of the input transistor based on the DC control voltage received at its base.

7. A differential amplifier as defined in claim 6, wherein the first and second correction circuit each further include
   a resistor for passing collector currents of the input transistor and of the feedback transistor to supply the pair of input signals having opposite phases to the differential amplifier.

8. A differential amplifier as defined in claim 5, wherein the difference detector includes a difference detection differential amplifier having a pair of difference detection transistors.

* * * * *